United States Patent
Morioka

(10) Patent No.: US 11,586,310 B2
(45) Date of Patent: Feb. 21, 2023

(54) DISPLAY SYSTEM AND CONTROL METHOD

(71) Applicant: Panasonic Intellectual Property Management Co., Ltd., Osaka (JP)

(72) Inventor: Yusuke Morioka, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/490,933

(22) Filed: Sep. 30, 2021

(65) Prior Publication Data

US 2022/0019307 A1    Jan. 20, 2022

Related U.S. Application Data

(63) Continuation of application No. PCT/JP2020/027709, filed on Jul. 16, 2020.

(30) Foreign Application Priority Data

Aug. 7, 2019 (JP) .............................. JP2019-145169
Dec. 5, 2019 (JP) .............................. JP2019-220397

(51) Int. Cl.
*G06F 3/041* (2006.01)
*G06F 3/04886* (2022.01)
(Continued)

(52) U.S. Cl.
CPC ........ *G06F 3/0412* (2013.01); *G06F 3/04166* (2019.05); *G06F 3/04886* (2013.01);
(Continued)

(58) Field of Classification Search
CPC ................ G02F 1/13338; H01H 36/00; G06F 2203/04803; G06F 3/02; G06F 3/0412;
(Continued)

(56) References Cited

U.S. PATENT DOCUMENTS 9,360,958 B2   6/2016 Kurokawa
10,318,052 B2   6/2019 Noto
(Continued)

FOREIGN PATENT DOCUMENTS

JP    2015-041248    3/2015
JP    2017-167250    9/2017
(Continued)

OTHER PUBLICATIONS

International Search Report (ISR) from International Searching Authority (Japan Patent Office) in International Pat. Appl. No. PCT/JP2020/027709, dated Sep. 24, 2020, together with an English language translation.

*Primary Examiner* — Robin J Mishler
(74) *Attorney, Agent, or Firm* — Greenblum & Bernstein, P.L.C.

(57) ABSTRACT

A display device includes multiple gate lines, multiple source lines, multiple pixel electrodes provided respectively in regions defined by the multiple gate lines and the multiple source lines, and multiple common electrodes provided to face the multiple pixel electrodes and used for both image display and touch detection. A second drive circuit supplies a touch drive signal to each of the multiple common electrodes. A touch detection circuit performs detection of a touch by an object on the display device, based on a touch detection signal received from each of the multiple common electrodes. The display device includes multiple touch detection regions. Among the multiple common electrodes, multiple common electrodes are arranged in each of the touch detection regions. In the display system, touch detection is performed in part of the multiple touch detection regions, and touch detection is not performed in rest of the multiple touch detection regions.

10 Claims, 12 Drawing Sheets

(51) Int. Cl.
*G02F 1/1333* (2006.01)
*G06F 3/044* (2006.01)

(52) U.S. Cl.
CPC .......... *G02F 1/13338* (2013.01); *G06F 3/044* (2013.01); *G06F 2203/04803* (2013.01)

(58) Field of Classification Search
CPC .. G06F 3/04166; G06F 3/04186; G06F 3/044; G06F 3/0443; G06F 3/04886; H03K 17/96
See application file for complete search history.

(56) References Cited

U.S. PATENT DOCUMENTS

| | | |
|---|---|---|
| 10,620,689 B2 | 4/2020 | Iwaki et al. |
| 10,928,949 B2 | 2/2021 | Noto |
| 2015/0054765 A1* | 2/2015 | Kurokawa ............ G06F 1/3262 345/173 |
| 2016/0328060 A1* | 11/2016 | Lai ........................ G06F 1/3262 |
| 2017/0269772 A1 | 9/2017 | Noto |
| 2017/0336901 A1* | 11/2017 | Mathew ................ G06F 3/0412 |
| 2018/0113501 A1 | 4/2018 | Iwaki et al. |
| 2019/0278423 A1 | 9/2019 | Noto |
| 2020/0241624 A1 | 7/2020 | Iwaki et al. |
| 2021/0157437 A1* | 5/2021 | Ujiie ..................... G06F 3/0362 |
| 2021/0407373 A1* | 12/2021 | Lai ........................ G06F 3/0446 |

FOREIGN PATENT DOCUMENTS

| | | |
|---|---|---|
| JP | 2018-073407 | 5/2018 |
| WO | 2018/123813 | 7/2018 |

* cited by examiner

22

DISPLAY SYSTEM AND CONTROL METHOD

BACKGROUND

1. Field

The present disclosure relates to a display system provided with a touch detection function, a control device, and a control method.

2. Description of the Related Art

An in-cell touch display device, in which a touch sensor for detecting a user's touch position is built into a display panel, is known (see Patent Literature 1, for example). In such a display device, a common electrode used to supply a common voltage to each pixel of a liquid crystal display panel is divided into multiple common electrodes, which are also used as touch sensor electrodes. During an image display period, a common voltage is supplied to each of the multiple common electrodes, and, during a touch detection period, a touch drive signal for touch detection is supplied to each of the multiple common electrodes.
Patent Literature 1: WO2018/123813

SUMMARY

For in-cell touch display devices, further improvement has been required.

To solve the problem above, a display system according to one aspect of the present disclosure includes: a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection; a drive circuit that supplies a touch drive signal to each of the multiple common electrodes; and a touch detection circuit that performs detection of a touch by an object on the display device, based on a touch detection signal received from each of the multiple common electrodes. The display device includes multiple touch detection regions, and, among the multiple common electrodes, multiple common electrodes are arranged in each of the touch detection regions. In the display system, touch detection is performed in part of the multiple touch detection regions, and touch detection is not performed in rest of the multiple touch detection regions.

Another aspect of the present disclosure is also a display system. The display system includes: a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection; a drive circuit that supplies a touch drive signal to each of the multiple common electrodes; and a touch detection circuit that performs detection of a touch by an object on the display device, based on a touch detection signal received from each of the multiple common electrodes. The display device includes multiple touch detection regions, and, among the multiple common electrodes, multiple common electrodes are arranged in each of the touch detection regions. The drive circuit supplies the touch drive signal to each of the multiple common electrodes when touch detection is performed in part of the multiple touch detection regions. The drive circuit does not supply the touch drive signal to each of the multiple common electrodes when touch detection is not performed in rest of the multiple touch detection regions.

Yet another aspect of the present disclosure is a control device. The control device controls a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection. The control device includes: a drive circuit that supplies a touch drive signal to each of the multiple common electrodes; and a touch detection circuit that performs detection of a touch by an object on the display device, based on a touch detection signal received from each of the multiple common electrodes. The display device includes multiple touch detection regions, and, among the multiple common electrodes, multiple common electrodes are arranged in each of the touch detection regions. The control device performs touch detection in part of the multiple touch detection regions and does not perform touch detection in rest of the multiple touch detection regions.

Still yet another aspect of the present disclosure is also a control device. The control device controls a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection. The control device includes: a drive circuit that supplies a touch drive signal to each of the multiple common electrodes; and a touch detection circuit that performs detection of a touch by an object on the display device, based on a touch detection signal received from each of the multiple common electrodes. The display device includes multiple touch detection regions, and, among the multiple common electrodes, multiple common electrodes are arranged in each of the touch detection regions. The drive circuit supplies the touch drive signal to each of the multiple common electrodes when touch detection is performed in part of the multiple touch detection regions. The drive circuit does not supply the touch drive signal to each of the multiple common electrodes when touch detection is not performed in rest of the multiple touch detection regions.

Still yet another aspect of the present disclosure is a control method. The control method is used to control a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection. The control method includes: supplying a touch drive signal to each of the multiple common electrodes; and performing detection of a touch by an object on the display device, based on a touch detection signal received from each of the multiple common electrodes. The display device includes multiple touch detection regions, and, among the multiple common electrodes, multiple common electrodes are arranged in each of the touch detection regions. Touch detection is performed in part of the multiple touch detection regions, and touch detection is not performed in rest of the multiple touch detection regions.

A further aspect of the present disclosure is also a control method. The control method is used to control a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection. The control method includes: supplying a touch drive signal to each of the multiple common electrodes; and performing detection of a touch by an object on the display device, based on a touch detection signal received from each of the multiple common electrodes. The display device includes multiple touch detection regions, and, among the multiple common electrodes, multiple common electrodes are arranged in each of the touch detection regions. When touch detection is performed in part of the multiple touch detection regions, the touch drive signal is supplied to each of the multiple common electrodes. When touch detection is performed in rest of the multiple touch detection regions, the touch drive signal is not supplied to each of the multiple common electrodes.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
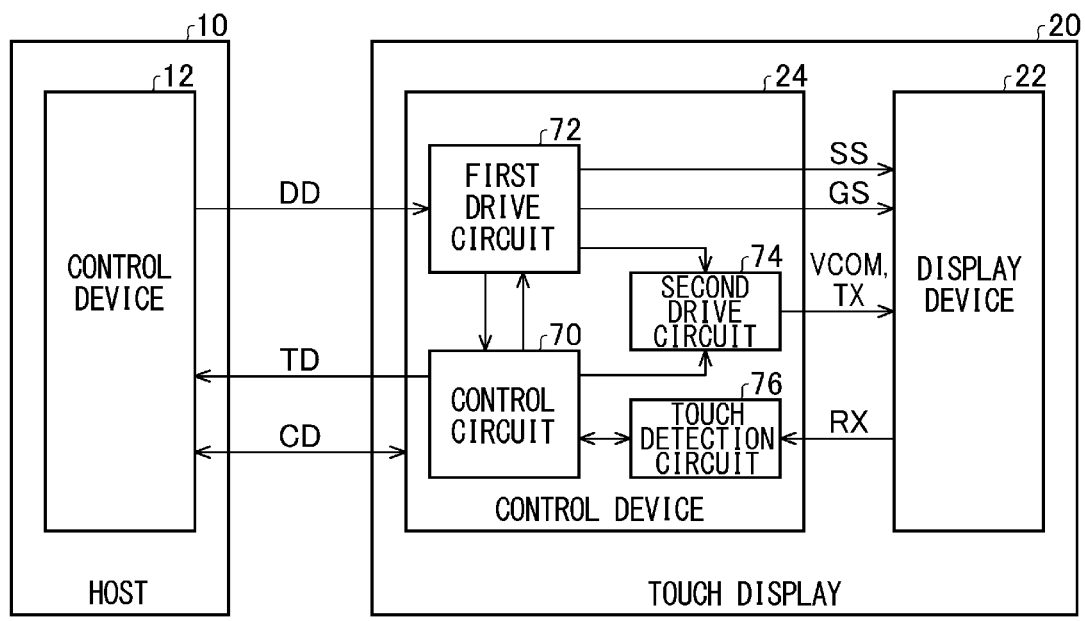
FIG. 1 is a block diagram of a display system according to a first embodiment.

The invention will now be described by reference to the preferred embodiments. This does not intend to limit the scope of the present invention, but to exemplify the invention.

Base Findings of Present Disclosure

Before specific description of embodiments is given, the base findings will be described. In an in-cell touch display, one frame period is temporally divided into multiple display periods and multiple touch detection periods. Also, a screen is divided into multiple touch detection regions (also called scan blocks), and touch detection is performed in a touch detection region different for each touch detection period, so that touch detection for one screen is performed in a frame period. The inventor has found a problem that, in such a display, reduction of processing related to touch detection has been desired. To solve the problem, a display system according to the present disclosure is configured as described below.

Like reference characters denote like or corresponding constituting elements, members, and processes in each drawing, and repetitive description will be omitted as appropriate. Also, the dimensions of a member may be appropriately enlarged or reduced in each drawing in order to facilitate understanding.

First Embodiment

FIG. 1 is a block diagram of a display system 1 according to a first embodiment. Although an example will be described in which the display system 1 is a vehicle-mounted display system 1 mounted on a vehicle, such as an automobile, the application is not particularly limited, and the display system 1 may also be used for a mobile device.

The display system 1 includes a host 10 and a touch display 20. The host 10 performs various functions, such as radio, car navigation, and Bluetooth (registered trademark) communication, and controls the touch display 20. The host 10 includes a control device 12.

The control device 12 may be a CPU, for example, and also called a host CPU. The control device 12 supplies image data DD and control data CD to the touch display 20 and controls the touch display 20 based on such data.

The touch display 20 includes a display device 22 and a control device 24. The display device 22 may be used as a center display on which a car navigation screen or the like is displayed within a vehicle cabin, for example.

The display device 22 is an in-cell liquid crystal display device of an in plane switching (IPS) type and capable of detecting a touch position. The configuration of the display device 22 may be a well-known configuration as described below, for example.

Figure 2:
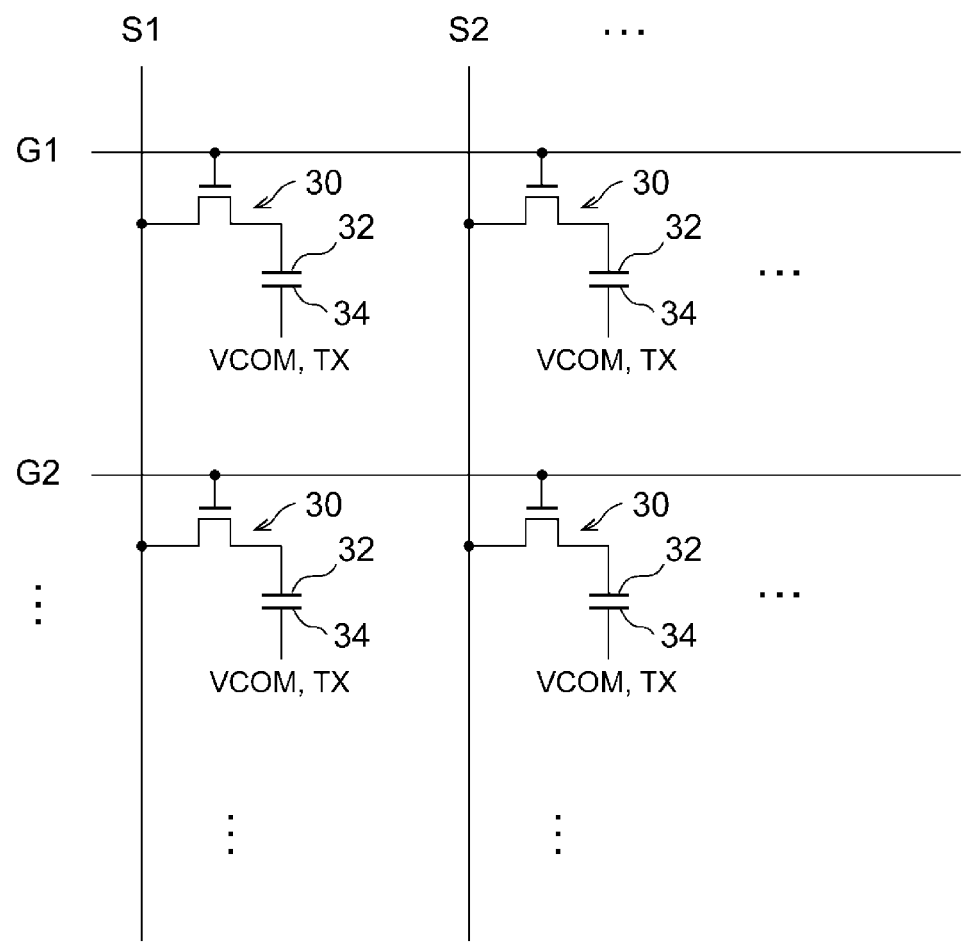
FIG. 2 is a diagram that schematically shows a circuit configuration of a display device shown in FIG. 1.

FIG. 2 schematically shows a circuit configuration of the display device 22 shown in FIG. 1. FIG. 2 also shows schematic arrangement of constituting elements. The display device 22 includes multiple gate lines G1, G2, and so on extending in a row direction, multiple source lines S1, S2, and so on extending in a column direction, multiple pixel switching elements 30, multiple pixel electrodes 32, and multiple common electrodes 34. Each pixel switching element 30 is a thin-film transistor provided near an intersection of a gate line and a source line such as to correspond to a pixel. In each pixel switching element 30, the gate is connected with a gate line, the source is connected with a source line, and the drain is connected with a pixel electrode 32. For one common electrode 34, multiple pixel switching elements 30 and multiple pixel electrodes 32 are arranged. The liquid crystal layer is controlled by means of electric fields between pixel electrodes 32 and common electrodes 34. The common electrodes 34 are used for both image display and touch detection. Accordingly, the number of electrode layers can be reduced, so that the display device 22 can be made thinner. The common electrodes 34 may also be referred to as sensor electrodes.

Figure 3:
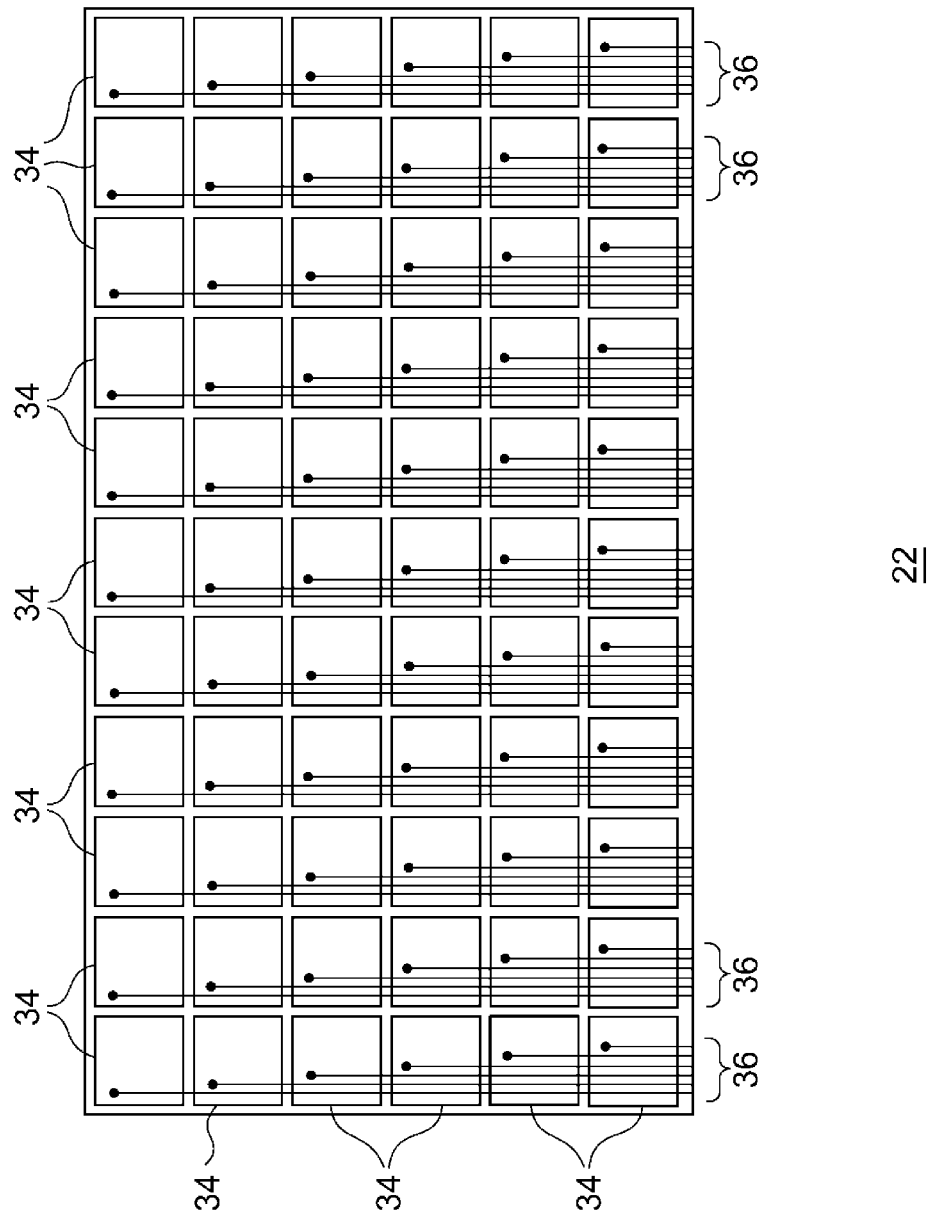
FIG. 3 is a top view that shows arrangement of common electrodes shown in FIG. 2.

FIG. 3 is a top view that shows arrangement of common electrodes 34 shown in FIG. 2. The multiple common electrodes 34 are arranged in a matrix. Each common electrode 34 is connected to the control device 24 with a signal line 36.

The display device 22 detects a touch position based on the self-capacitance method. When a finger is brought closer to the display surface of the display device 22, capacitance is formed between a common electrode 34 and the finger. The formation of capacitance increases parasitic capacitance in the common electrode 34, so that the current flowing when a touch drive signal is supplied to the common electrode 34 is increased. Based on the current variation, the touch position is detected.

Figure 4:
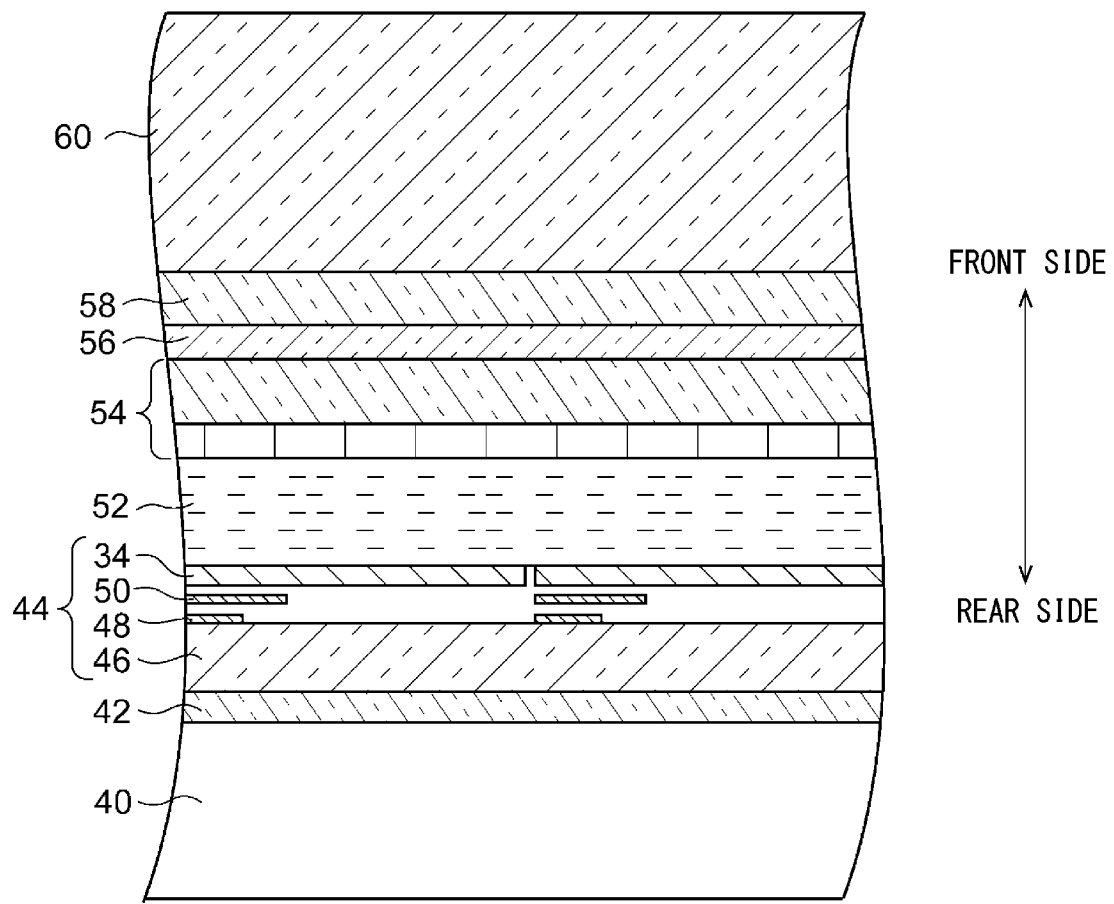
FIG. 4 is a longitudinal sectional view of the display device shown in FIG. 1.

FIG. 4 is a longitudinal sectional view of the display device 22 shown in FIG. 1. The display device 22 includes a backlight unit 40, a lower polarizer 42, a thin-film transistor substrate (hereinafter, referred to as a TFT substrate) 44, a liquid crystal layer 52, a color filter substrate 54, an upper polarizer 56, a bonding layer 58, and a protection layer 60, which are laminated and disposed in this order along a depth direction.

In the following, with regard to the depth directions of the display device 22, the side on which the protection layer 60 is positioned with respect to the TFT substrate 44 is defined as the front side, and the opposite side is defined as the rear side.

Using the light emitted from the backlight unit 40, the display device 22 emits image light toward the front side, or the viewer side.

The TFT substrate 44 includes a glass substrate 46 and also includes multiple gate electrodes 48, multiple source electrodes 50, and multiple common electrodes 34, which are arranged on the front side of the glass substrate 46. The TFT substrate 44 also includes the multiple gate lines G1, G2, and so on, the multiple source lines S1, S2, and so on, the multiple pixel electrodes 32, and the multiple pixel switching elements 30 shown in FIG. 2, though illustration thereof is omitted. The liquid crystal layer 52 disposed on the front side of the TFT substrate 44 is controlled by means of lateral electric fields that occur between pixel electrodes 32 and common electrodes 34.

The bonding layer 58 has translucency and bonds the upper polarizer 56 and the protection layer 60. The bonding layer 58 may be formed by curing a transparent resin in a liquid state, such as optically clear resin (OCR), or curing a transparent adhesive sheet, such as optically clear adhesive (OCA), for example.

The protection layer 60 is a layer that has translucency and protects the display device 22, and the protection layer 60 is constituted by a glass substrate or a plastic substrate, for example. The protection layer 60 is also called a cover lens or the like.

The description now returns to FIG. 1. The control device 24 may be configured as an IC, for example, and controls the display device 22 based on the control data CD and the image data DD from the host 10. The control device 24 includes a control circuit 70, a first drive circuit 72, a second drive circuit 74, and a touch detection circuit 76.

The control circuit 70 may be configured as a microcomputer, for example, and controls signal generation timings of the first drive circuit 72 and the second drive circuit 74, touch detection timings of the touch detection circuit 76, and the like.

The control circuit 70 controls the first drive circuit 72, the second drive circuit 74, and the touch detection circuit 76 such that, during a frame period (one frame period), one frame of a display image is rendered on the display device 22 and touch detection for one screen is performed at least once. The frame period may also be referred to as a vertical synchronization period. The frame period will be detailed later.

The first drive circuit 72 generates a reference clock signal under the control of the control circuit 70. The first drive circuit 72 also generates, under the control of the control circuit 70, a source signal SS in synchronization with the generated reference clock signal, based on the image data DD from the host 10. The first drive circuit 72 also generates, under the control of the control circuit 70, a gate signal GS in synchronization with the generated reference clock signal.

The first drive circuit 72 supplies the source signal SS serially to multiple source lines in the display device 22 and also supplies the gate signal GS serially to multiple gate lines in the display device 22.

The first drive circuit 72 supplies the reference clock signal to the second drive circuit 74. The second drive circuit 74 generates a reference voltage VCOM, which is a predetermined fixed voltage, and a touch drive signal TX in synchronization with the reference clock signal, under the control of the control circuit 70. The touch drive signal TX may be a square wave signal, or may be a sine wave signal. Through the signal lines 36 shown in FIG. 3, the second drive circuit 74 supplies the reference voltage VCOM or the touch drive signal TX to the multiple common electrodes 34 of the entire display device 22.

The touch detection circuit 76 detects a touch by an object on the display device 22. Under the control of the control circuit 70, the touch detection circuit 76 performs detection of a touch by an object on a position corresponding to a common electrode 34, based on a touch detection signal Rx received from the common electrode 34 when the touch drive signal TX is supplied to each common electrode 34.

The touch detection circuit 76 integrates the touch detection signal Rx received from each common electrode 34 and derives, as a detection value, a difference between the integral value and a reference value, for each pulse timing of the touch drive signal TX. For the touch detection signal Rx received from one common electrode 34 during one touch detection period, the number of obtained detection values is equal to the number of pulses in the touch drive signal TX within one touch detection period. Each detection value represents a difference value between the capacitance of the common electrode 34 and a reference capacitance. When the capacitance variation in a common electrode 34 due to a touch by an object is larger, the detection value becomes larger. When there is no touch and the capacitance variation in a common electrode 34 is zero, the detection value is also zero. For each of the touch detection signals Rx received from the common electrodes 34, the touch detection circuit 76 derives the sum of multiple detection values within one touch detection period.

The touch detection circuit 76 compares the sum of the detection values derived based on the touch detection signal Rx received from each common electrode 34 with a predetermined touch detection threshold. When the sum of the detection values is greater than or equal to the touch detection threshold, the touch detection circuit 76 judges that there has been a touch to the position of the corresponding common electrode 34. This corresponds to that a touch is detected. Based on the position of the common electrode 34 to which it is judged that there has been a touch, the touch detection circuit 76 detects a touch position within the screen. The touch detection circuit 76 outputs information regarding the touch position thus detected to the control circuit 70.

Based on the information regarding the touch position from the touch detection circuit 76, the control circuit 70 derives coordinate data TD of the touch position and outputs the coordinate data TD to the control device 12 in the host 10. The control device 12 performs various processes based on the coordinate data TD.

The configurations of the control device 12 and the control circuit 70 can be implemented by cooperation between hardware resources and software resources or only by hardware resources. As the hardware resources, analog devices, microcomputers, DSPs, ROMs, RAMs, FPGAs, or other LSIs can be employed. As the software resources, programs, such as firmware, can be employed.

In the following, the control of the display device 22 performed by the control circuit 70 and the operations of the display device 22 will be specifically described. The control circuit 70 alternately repeats partial image display on one of multiple display regions within the screen and partial touch detection on one of multiple touch detection regions within the screen, so as to control the image display and the touch detection in a time division manner.

Figure 5:
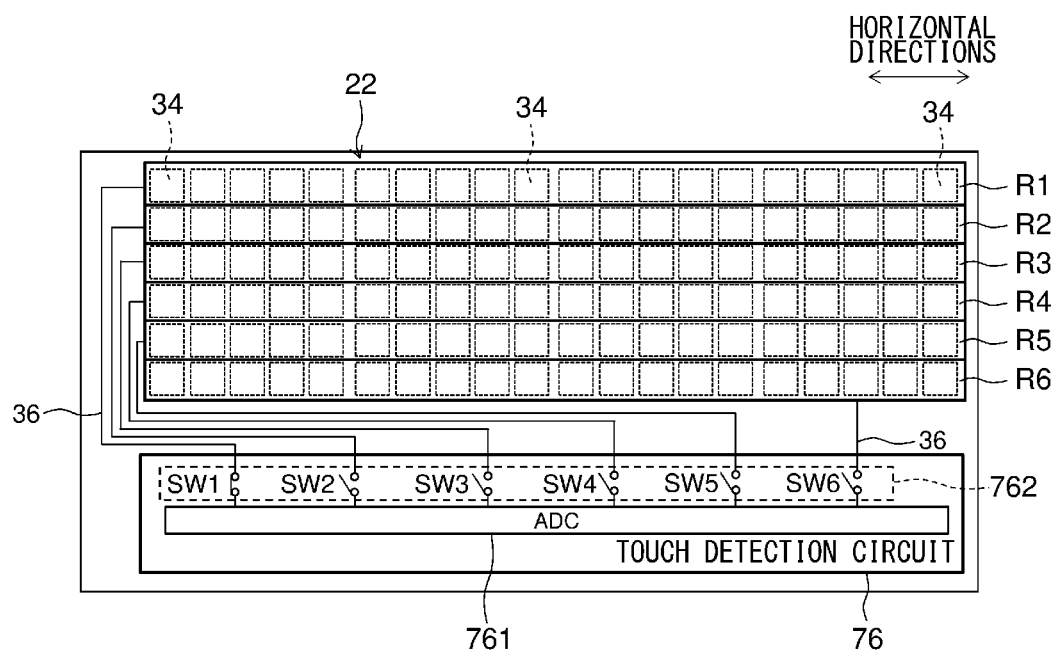
FIG. 5 is a diagram used to describe operations of the display device shown in FIG. 1.

FIG. 5 is a diagram used to describe operations of the display device 22 shown in FIG. 1. The display device 22 includes six touch detection regions R1, R2, R3, R4, R5, and R6, which are configured by dividing the multiple common electrodes 34 within the screen into multiple groups. Each of the touch detection regions R1 through R6 is horizontally elongated, and the touch detection regions R1 through R6 are vertically arranged serially from the top to the bottom, when viewed from the viewer. Among the multiple common electrodes 34 of the entire display device 22, multiple common electrodes 34 are arranged in each of the touch detection regions R1 through R6. The number of common electrodes 34 arranged in each touch detection region shown in FIG. 5 is set as an example. Also, the number of touch detection regions is not limited to "six". The touch detection regions may be horizontally arranged when viewed from the viewer.

The touch detection circuit 76 includes an A/D converter 761 and switches SW1, SW2, SW3, SW4, SW5, and SW6. Each switch includes multiple pairs of an input terminal and an output terminal, though illustration thereof is omitted. For simplified drawing, the connections between the common electrodes 34 and the signal lines 36 are omitted in FIG. 5.

The multiple input terminals of the switch SW1 are respectively connected to the multiple common electrodes 34 included in the touch detection region R1 on a one-to-one basis, with the signal lines 36. The multiple input terminals of the switch SW2 are respectively connected to the multiple common electrodes 34 included in the touch detection region R2 on a one-to-one basis, with the signal lines 36. The multiple input terminals of the switch SW3 are respectively connected to the multiple common electrodes 34 included in the touch detection region R3 on a one-to-one basis, with the signal lines 36. The multiple input terminals of the switch SW4 are respectively connected to the multiple common electrodes 34 included in the touch detection region R4 on a one-to-one basis, with the signal lines 36. The multiple input terminals of the switch SW5 are respectively connected to the multiple common electrodes 34 included in the touch detection region R5 on a one-to-one basis, with the signal lines 36. The multiple input terminals of the switch SW6 are respectively connected to the multiple common electrodes 34 included in the touch detection region R6 on a one-to-one basis, with the signal lines 36.

The output terminals of the switches SW1 through SW6 are connected to input ports of the A/D converter 761. Since the number of input ports of the A/D converter 761 is lower than the number of common electrodes 34 within the screen, the common electrodes 34 connected to the input ports of the A/D converter 761 are switched by means of the switches. The number of input ports of the A/D converter 761 is equal to the number of input signals that can be simultaneously processed at the A/D converter 761, and may also be referred to as the number of input channels.

The control circuit 70 performs different control operations depending on whether or not an image displayed on the display device 22 includes a region where touch detection is unnecessary.

(1) When the Image does not Include a Region where Touch Detection is Unnecessary The display device 22 displays, on the entire screen, a second image constituted by regions where touch detection is necessary. The second image, for the entire of which touch detection is necessary, may be an image on which a touch operation or a swipe operation needs to be accepted in an arbitrary position within the screen, such as a map image.

For each of multiple second images, the control device 12 retains, in advance, information that specifies a touch detection region where touch detection is to be performed in the second image. When the control device 12 supplies the image data DD of a second image to the touch display 20, the control device 12 also supplies the control data CD that include information specifying the touch detection regions R1 through R6 in which touch detection is to be performed. Based on the control data CD thus supplied, the control circuit 70 sets display periods and touch detection periods in a frame period Fa and controls the first drive circuit 72 and the second drive circuit 74 based on the information thus set.

Figure 6:
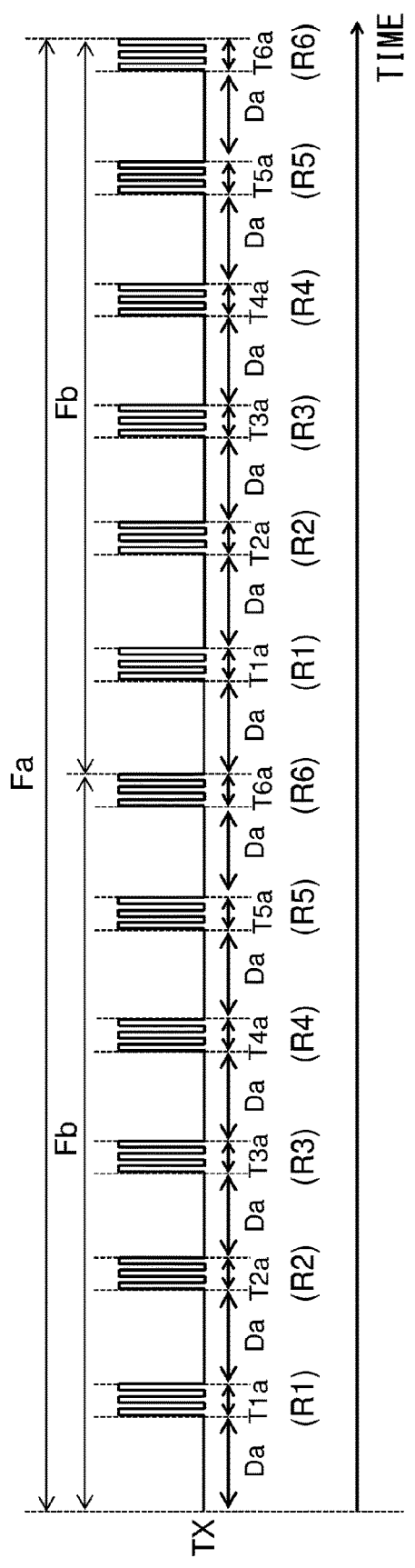
FIG. 6 is a diagram that shows timings and a waveform of a touch drive signal within a frame period when a second image is displayed on the display device shown in FIG. 1.

FIG. 6 shows timings and a waveform of a touch drive signal TX within a frame period Fa when a second image is displayed on the display device 22 shown in FIG. 1.

In the example shown in FIG. 6, within the frame period (one frame period) Fa, one image is displayed and touch detection for one screen is performed twice. In the present embodiment, the display device 22 is assumed to be a display device driven at 60 Hz to display an image, so that a frame period Fa is set to about 16.7 ($=\frac{1}{60}$) ms. Since the touch detection for one screen is performed twice within a frame period Fa, the touch detection is performed with a period of about 8.3 ($=\frac{1}{120}$) ms.

A frame period Fa is divided into two sub-frame periods Fb. Each sub-frame period Fb includes six display periods Da and six touch detection periods T1a, T2a, T3a, T4a, T5a, and T6a. The display periods Da and the touch detection periods are alternately arranged. In each sub-frame period Fb, the display period Da, touch detection period T1a, display period Da, touch detection period T2a, display period Da, touch detection period T3a, display period Da, touch detection period T4a, display period Da, touch detection period T5a, display period Da, and touch detection period T6a are arranged in this order. The number of display periods Da and the number of touch detection periods in a frame period Fa are not limited to "twelve".

The display device 22 displays one-twelfth of a frame for each display period Da. Accordingly, one frame is displayed in the twelve display periods Da within a frame period Fa. More specifically, during a display period Da, the first drive circuit 72 supplies the source signal SS to the multiple source lines and also supplies the gate signal GS to corresponding gate lines, and the second drive circuit 74 supplies the reference voltage VCOM to the multiple common electrodes 34. The second drive circuit 74 stops supply of the touch drive signal TX during the display periods Da.

During each touch detection period, the second drive circuit 74 supplies the touch drive signal TX to the multiple common electrodes 34 in the touch detection regions R1 through R6. The second drive circuit 74 stops supply of the reference voltage VCOM during the touch detection periods.

The control circuit 70 makes a different one of the switches SW1 through SW6 conductive for each touch detection period. The touch detection signals Rx input to the switch thus made conductive are output to the A/D converter 761. The A/D converter 761 converts the analog touch detection signals Rx input via the switch into digital touch detection signals.

During the touch detection period T1a, the touch detection circuit 76 performs detection of a touch by an object on the touch detection region R1, based on the touch detection signals Rx received from the multiple common electrodes 34 in the touch detection region R1. Also, during the touch detection period T2a, the touch detection circuit 76 performs detection of a touch by an object on the touch detection region R2, based on the touch detection signals Rx received from the multiple common electrodes 34 in the touch detection region R2.

During the touch detection period T3a, the touch detection circuit 76 performs detection of a touch by an object on the touch detection region R3, based on the touch detection signals Rx received from the multiple common electrodes 34 in the touch detection region R3. Also, during the touch detection period T4a, the touch detection circuit 76 performs detection of a touch by an object on the touch detection region R4, based on the touch detection signals Rx received from the multiple common electrodes 34 in the touch detection region R4.

During the touch detection period T5a, the touch detection circuit 76 performs detection of a touch by an object on the touch detection region R5, based on the touch detection signals Rx received from the multiple common electrodes 34 in the touch detection region R5. Also, during the touch detection period T6a, the touch detection circuit 76 performs detection of a touch by an object on the touch detection region R6, based on the touch detection signals Rx received from the multiple common electrodes 34 in the touch detection region R6.

Thus, to perform touch detection on the entire screen, the touch detection circuit 76 performs touch detection in a touch detection region different for each touch detection period during a frame period Fa. In other words, the touch detection circuit 76 serially changes the touch detection region as a detection target. Accordingly, the touch detection circuit 76 performs touch detection in each of the multiple touch detection regions R1 through R6. During the twelve touch detection periods in a frame period Fa, touch detection for one screen is performed twice. Therefore, touch detection can be performed on the entire image. The display device 22 may include touch detection regions equal in number to the touch detection periods in a frame period Fa, and, in this case, the touch detection for one screen is performed once during the multiple touch detection periods in a frame period Fa.

(2) When the Image Includes a Region where Touch Detection is Unnecessary

The display device 22 displays a first image that includes a region where touch detection is unnecessary. The first image may be a menu screen, a setting screen, a television screen, or an audio screen, for example. In the following, an example of a menu screen will be described.

Figure 7:
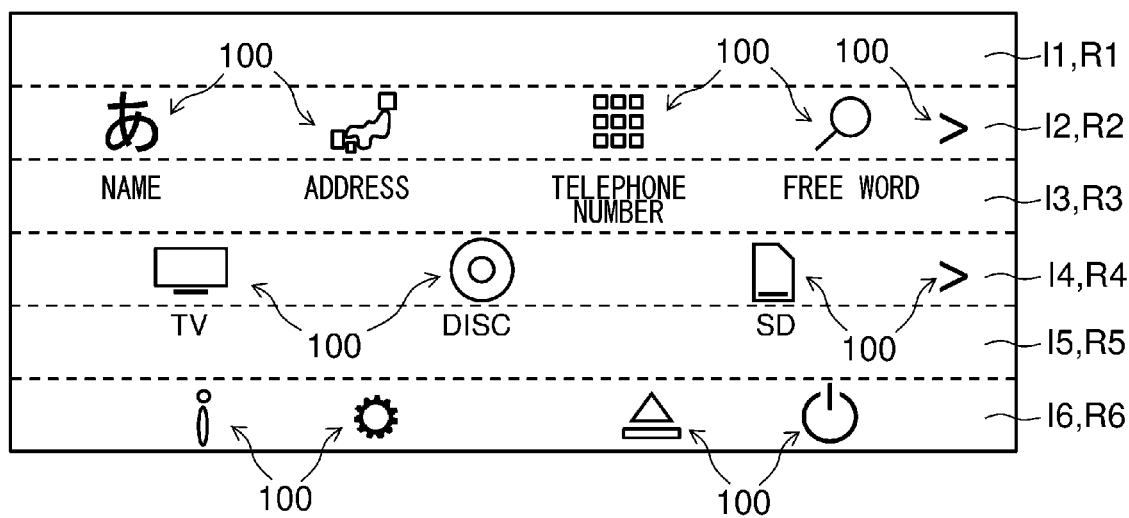
FIG. 7 is a diagram that illustrates a menu screen displayed on the display device shown in FIG. 1.

FIG. 7 illustrates a menu screen displayed on the display device 22 shown in FIG. 1. The menu screen includes three first image regions I2, I4, and I6 in which touch detection is necessary, and three second image regions I1, I3, and I5 in which touch detection is unnecessary. The menu screen includes a graphical user interface (GUI) 100 displayed in each of the first image regions I2, I4, and I6. The GUIs 100 include icons. In each of the second image regions I1, I3, and I5, GUIs 100 are not displayed.

The touch detection region R2 coincides with the first image region I2, the touch detection region R4 coincides with the first image region I4, and the touch detection region R6 coincides with the first image region I6. Also, the touch detection region R1 coincides with the second image region I1, the touch detection region R3 coincides with the second image region I3, and the touch detection region R5 coincides with the second image region I5. If touch detection regions corresponding to first image regions include the respective first image regions, each touch detection region need not necessarily coincide with the corresponding first image region or second image region.

It is assumed here that, even if a touch is detected in the second image region I1, I3, or I5 in which a GUI 100 is not disposed, the coordinate data TD of the obtained touch position is not used in the control device 12. Accordingly, the touch detection circuit 76 performs touch detection in part of the touch detection regions R1 through R6, i.e., the touch detection regions R2, R4, and R6 defined based on the first image regions I2, I4, and I6. Meanwhile, the touch detection circuit 76 does not perform touch detection in the rest of the touch detection regions R1 through R6, i.e., the touch detection regions R1, R3, and R5 defined based on the second image regions I1, I3, and I5. More specifically, the control circuit 70 makes the switch SW1 non-conductive during the touch detection period T1a, makes the switch SW3 non-conductive during the touch detection period T3a, and makes the switch SW5 non-conductive during the touch detection period T5a, for example. Accordingly, the touch detection circuit 76 does not receive the touch detection signals Rx from the common electrodes 34 included in the touch detection regions R1, R3, and R5. Also, during the touch detection periods T1a, T3a, and T5a, the touch detection circuit 76 does not perform one or more signal processes for judging whether or not there has been a touch, with respect to the touch detection signals Rx supplied from the common electrodes 34 included in the touch detection regions R1, R3, and R5, for example. This means that the touch detection circuit 76 does not perform touch detection in the touch detection regions R1, R3, and R5. Also, with respect to the information regarding a touch position in the touch detection regions R1, R3, and R5 supplied from the touch detection circuit 76, the control circuit 70 does not derive the coordinate data TD of the touch position, for example. Also, the control circuit 70 does not supply the coordinate data TD indicating a touch position in the touch detection regions R1, R3, and R5 to the control device 12 in the host 10, for example. Also, with respect to the coordinate data TD indicating the touch detection regions R1, R3, and R5 supplied from the control circuit 70, the control device 12 in the host 10 does not perform various processes required therefor, for example. These can reduce the processing related to touch detection when a first image is displayed.

The number of touch detection regions where touch detection is performed and the number of touch detection regions where touch detection is not performed need not necessarily be equal, and each of such numbers has only to be one or greater.

For each of multiple first images, such as a menu screen and a setting screen, the control device 12 retains, in advance, information that specifies a touch detection region where touch detection is to be performed in the first image.

When the control device 12 supplies the image data DD of the first image shown in FIG. 7 to the touch display 20, the control device 12 also supplies the control data CD that include information specifying the touch detection regions R2, R4, and R6 in which touch detection is to be performed. Based on the control data CD thus supplied, the control circuit 70 sets display periods and touch detection periods in a frame period Fa and controls the first drive circuit 72 and the second drive circuit 74 based on the information thus set. Accordingly, since a touch detection region where touch detection is to be performed can be set for each first image, touch detection can be performed only in a necessary region.

Figure 8:
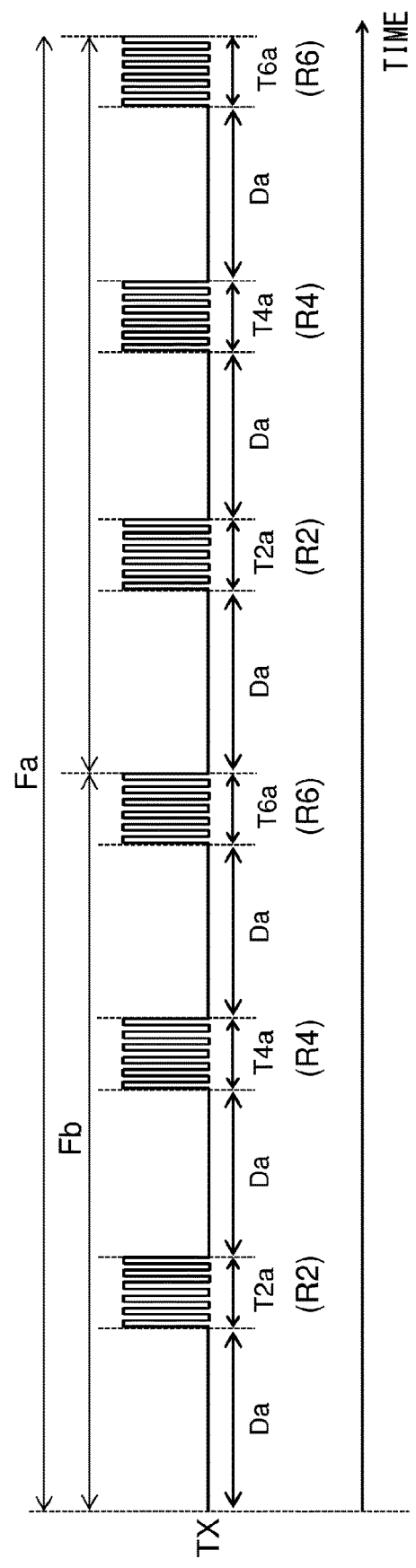
FIG. 8 is a diagram that shows timings and a waveform of a touch drive signal within a frame period when a first image is displayed on the display device shown in FIG. 1.

FIG. 8 shows timings and a waveform of a touch drive signal TX within a frame period Fa when a first image is displayed on the display device 22 shown in FIG. 1. The length of the frame period Fa and the length of each sub-frame period Fb are identical with those in the example of FIG. 6.

Each sub-frame period Fb includes three display periods Da and three touch detection periods T2a, T4a, and T6a and does not include the touch detection periods T1a, T3a, and T5a. The display periods Da and the touch detection periods are alternately arranged. In each sub-frame period Fb, the display period Da, touch detection period T2a, display period Da, touch detection period T4a, display period Da, and touch detection period T6a are arranged in this order. Thus, in a frame period Fa, the number of touch detection periods is lower than the number of touch detection periods when a second image is displayed, and the number of display periods Da is also lower than the number of display periods Da when a second image is displayed.

The display device 22 displays one-sixth of a frame for each display period Da. Accordingly, one frame is displayed in the six display periods Da within a frame period Fa. During the six touch detection periods in a frame period Fa, touch detection for part of one screen is performed twice.

The length of a display period Da is twice the length of a display period Da when a second image is displayed shown in FIG. 6. Within a frame period Fa, the sum of the display periods Da is equal to the sum of the display periods Da when a second image is displayed.

Within a frame period Fa, the sum of the touch detection periods is also equal to the sum of the touch detection periods when a second image is displayed. The length of a touch detection period is twice the length of a touch detection period when a second image is displayed. Accordingly, the number of pulses in the touch drive signal TX included in a touch detection period is twice the number of pulses when a second image is displayed. Therefore, during each touch detection period, the touch detection circuit 76 derives detection values of which the number is twice the number of detection values when a second image is displayed. Accordingly, when a first image is displayed, the value of the sum of the detection values in each touch detection period can be made greater than that when a second image is displayed, thereby improving the touch detection sensitivity.

In the display device 22 to be mounted on a vehicle, a resin cover, instead of glass, is increasingly used for a protection layer disposed on the front side of the display device 22, for the reasons of safety and increased demand for curved surface displays. Since a resin cover has a lower dielectric constant than glass, the touch sensitivity may be lowered. However, in the present embodiment, the sensitivity can be improved even with a resin cover.

Modification of First Embodiment

Figure 9:
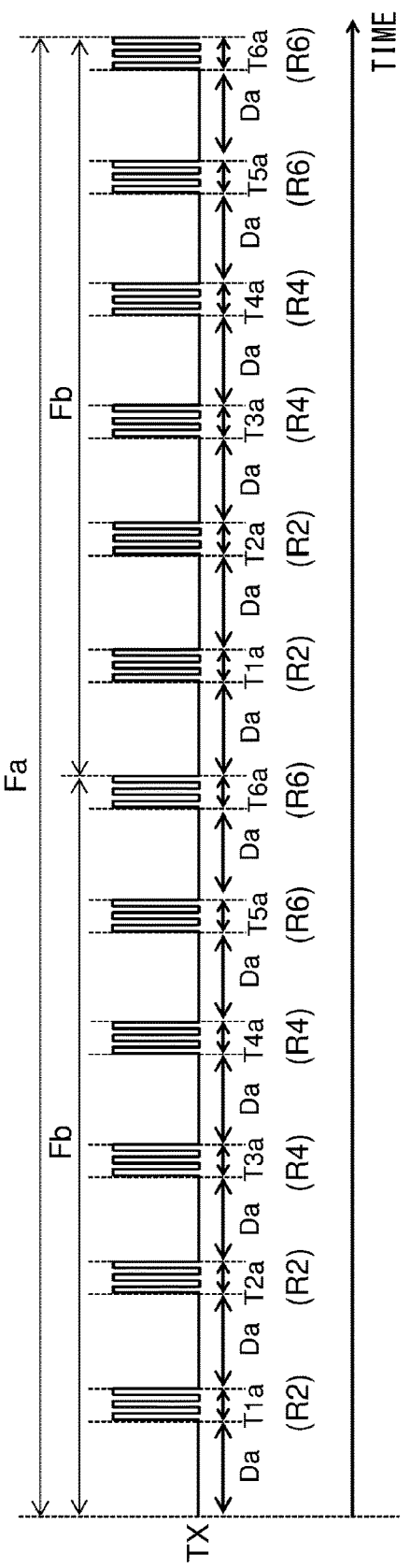
FIG. 9 is a diagram that shows timings and a waveform of a touch drive signal within a frame period when a first image is displayed in a modification of the first embodiment.

FIG. 9 shows timings and a waveform of a touch drive signal TX within a frame period Fa when a first image is displayed in a modification of the first embodiment.

In FIG. 9, the length of a display period Da, the length of a touch detection period, the number of touch detection periods, the number of display periods Da, and the arrangement of the display periods Da and the touch detection periods T1a through T6a are identical with those in the case where a second image is displayed in the first embodiment. However, the touch detection region where touch detection is performed in each of the touch detection periods T1a, T3a, and T5a is different from that when a second image is displayed. During the touch detection period T1a, touch detection is performed in the touch detection region R2, instead of the touch detection region R1. During the touch detection period T3a, touch detection is performed in the touch detection region R4, instead of the touch detection region R3. During the touch detection period T5a, touch detection is performed in the touch detection region R6, instead of the touch detection region R5.

During each sub-frame period Fb, the touch detection circuit 76 performs touch detection in the touch detection region R2 based on the sum of the detection values obtained during the two touch detection periods T1a and T2a, performs touch detection in the touch detection region R4 based on the sum of the detection values obtained during the two touch detection periods T3a and T4a, and performs touch detection in the touch detection region R6 based on the sum of the detection values obtained during the two touch detection periods T5a and T6a. This corresponds to performing, when a first image is displayed, touch detection by the touch detection circuit 76 in a touch detection region as a detection target for multiple touch detection periods, based on the touch detection signals Rx received from the common electrodes 34 in the touch detection region as a detection target during the multiple touch detection periods. Also with this configuration, touch detection sensitivity can be improved.

Second Embodiment

The second embodiment differs from the first embodiment in that, when touch detection is performed on part of the screen, the sum of the touch detection periods within a frame period Fa is shorter than that when touch detection is performed on the entire screen. In the following, description will be given mainly for the differences from the first embodiment.

Figure 10:
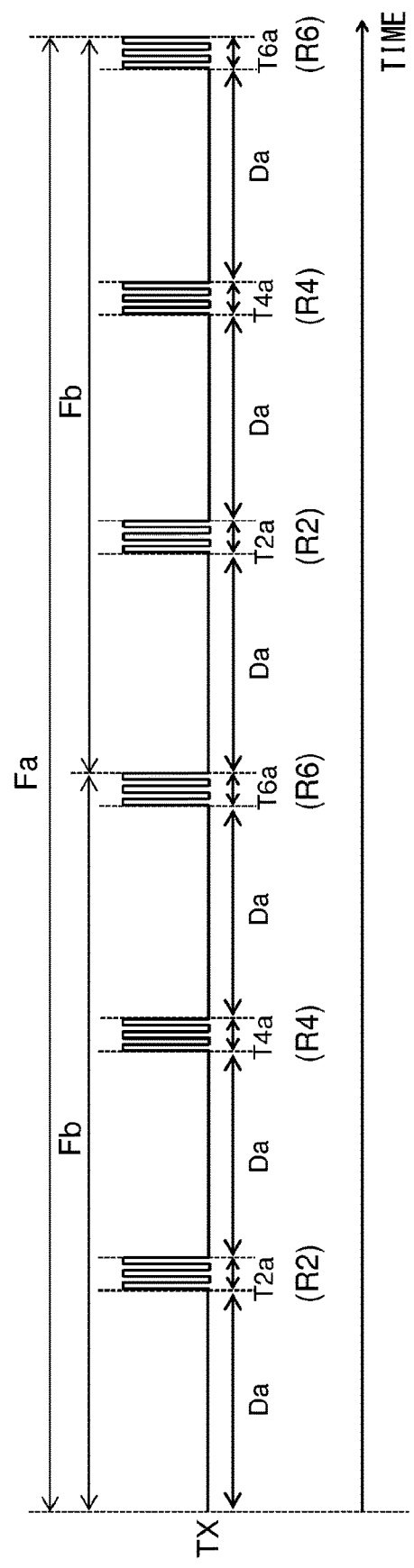
FIG. 10 is a diagram that shows timings and a waveform of a touch drive signal within a frame period when a first image is displayed in a second embodiment.

FIG. 10 shows timings and a waveform of a touch drive signal TX within a frame period Fa when a first image is displayed in the second embodiment.

Each sub-frame period Fb includes three display periods Da and three touch detection periods T2a, T4a, and T6a and does not include the three touch detection periods T1a, T3a, and T5a. Thus, in a frame period Fa, the number of touch detection periods is lower than the number of touch detection periods when a second image is displayed, and the number of display periods Da is also lower than the number of display periods Da when a second image is displayed.

The length of a touch detection period is identical with the length of a touch detection period when a second image is displayed shown in FIG. 6. Accordingly, within a frame period Fa, the sum of the touch detection periods is shorter than the sum of the touch detection periods when a second image is displayed. In other words, the duration of supply of the touch drive signal TX within a frame period Fa is shorter than that when a second image is displayed. Therefore, radiation caused by the touch drive signal TX can be reduced, and power consumption can also be reduced.

As shown in FIG. 4, in the display device 22, electrodes are not provided on the front side of the common electrodes 34. Accordingly, the display device 22 is more likely to radiate noise than an out-cell touch display device, in which touch sensor electrodes are arranged on the side closer to the viewer than the common electrodes. Therefore, radiation of electromagnetic waves due to the touch drive signal TX is more likely to occur, and such radiation may affect a peripheral receiver and the like. In the present embodiment, however, influence of radiation on the surroundings can be restrained.

The length of a display period Da is obtained by adding a touch detection period to twice the length of a display period Da when a second image is displayed shown in FIG. 6. Accordingly, within a frame period Fa, the sum of the multiple display periods Da is longer by six times the touch detection period than the sum of the multiple display periods Da when a second image is displayed.

Under the control of the control circuit 70, the first drive circuit 72 generates a source signal SS that has a lower frequency than the source signal SS in the case of a second image. The first drive circuit 72 also generates, under the control of the control circuit 70, a gate signal GS that has a lower frequency than the gate signal GS in the case of a second image. The frequencies can be set based on the sum of the lengths of the display periods Da within a frame period. Accordingly, compared to the case where a second image is displayed, the charging time of the pixel electrodes 32 can be ensured more easily, so that the color reproducibility of each pixel can be enhanced, and the image quality can be improved.

Modification of Second Embodiment

When the frequency of exogenous noise emitted from an electronic device or the like around the display system 1 is identical with the frequency of the touch drive signal TX, the accuracy and sensitivity of touch detection may be degraded. Accordingly, in the display system 1, based on the amount of exogenous noise, so-called frequency hopping control may be performed. For the frequency hopping, well-known technologies may be employed.

When a second image is displayed, a noise detection period is provided between two neighboring frame periods Fa among every a predetermined number of frame periods Fa. During a noise detection period, the second drive circuit 74 stops supply of the touch drive signal TX and supplies the reference voltage VCOM. Also, during a noise detection period, the touch detection circuit 76 measures the amount of noise at each of predetermined multiple frequencies included in the touch detection signals RX received from the multiple common electrodes 34. The multiple frequencies include the frequency of the touch drive signal TX. When noise at the frequency of the touch drive signal TX is detected at a predetermined level or higher, the touch detection circuit 76 outputs, to the control circuit 70, noise detection information that includes information regarding a frequency at which the minimum amount of noise has been measured.

Based on the noise detection information, the control circuit 70 controls the second drive circuit 74 such as to change the frequency of the touch drive signal TX to the frequency at which the amount of noise is minimum. Under the control of the control circuit 70, the second drive circuit 74 supplies, to the common electrodes 34, a touch drive signal TX having the frequency at which the amount of noise is minimum, i.e., a touch drive signal TX having a frequency different from the frequency at which the level of noise is the predetermined level or higher. This can restrain degradation of accuracy and sensitivity of touch detection caused by exogenous noise.

When a first image is displayed, the control circuit 70 sets, as a noise detection period, one of the touch detection periods T1a, T3a, and T5a provided when a second image is displayed, within every a predetermined number of frame periods Fa. This eliminates the need for the noise detection period between two frame periods Fa.

Third Embodiment

The third embodiment differs from the first embodiment in that, when a first image is displayed, the touch detection circuit 76 performs touch detection in all the touch detection regions but, while touch detection is performed in a touch detection region where touch detection is unnecessary, the supply of the touch drive signal TX is stopped. In the following, description will be given mainly for the differences from the first embodiment.

Figure 11:
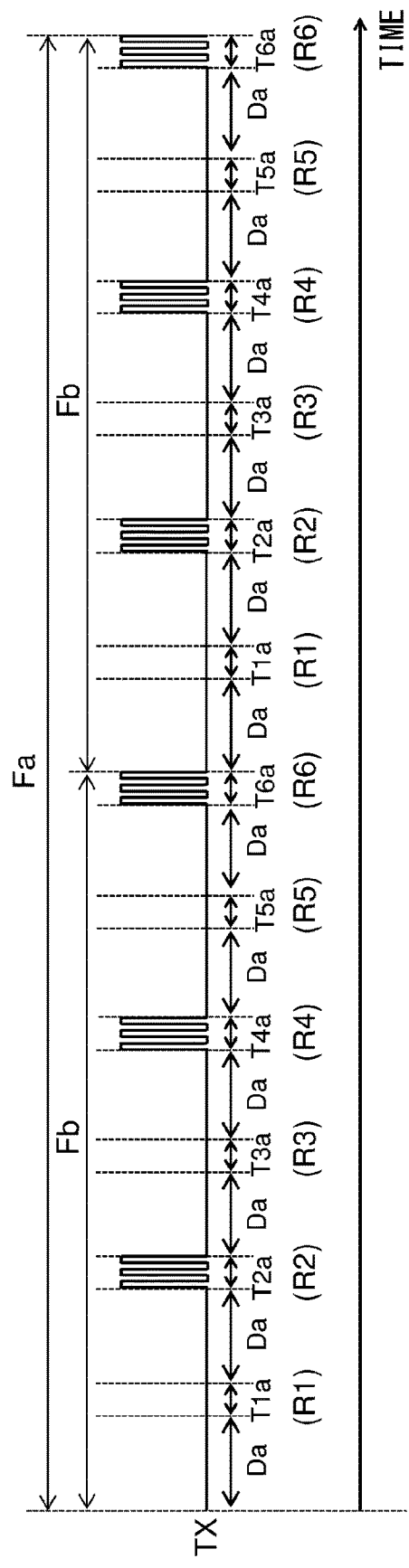
FIG. 11 is a diagram that shows timings and a waveform of a touch drive signal within a frame period when a first image is displayed in a third embodiment.

FIG. 11 shows timings and a waveform of a touch drive signal TX within a frame period Fa when a first image is displayed in the third embodiment. As is the case where a second image is displayed, during each of multiple touch detection periods, the touch detection circuit 76 performs touch detection in a touch detection region different for each touch detection period.

When the touch detection circuit 76 performs touch detection in part of the multiple touch detection regions, i.e., the touch detection regions R2, R4, and R6 defined based on the first image regions I2, I4, and I6, the second drive circuit 74 supplies the touch drive signal TX to each of the multiple common electrodes 34.

When the touch detection circuit 76 performs touch detection in the rest of the multiple touch detection regions, i.e., the touch detection regions R1, R3, and R5 defined based on the second image regions I1, I3, and I5, the second drive circuit 74 does not supply the touch drive signal TX to each of the multiple common electrodes 34. Accordingly, compared to the case where a second image is displayed, the duration of supply of the touch drive signal TX within a frame period Fa becomes shorter, so that radiation caused by the touch drive signal TX can be reduced.

Also, since the touch drive signal TX is not supplied, even when there is a touch in any of the touch detection regions R1, R3, and R5, it is not judged that there has been a touch.

However, even when the touch drive signal TX is not supplied, there may be a case where, because of noise, it is incorrectly judged that there has been a touch in any of the touch detection regions R1, R3, and R5. Accordingly, the display device 22 may be set such that touch detection is not performed in R1, R3, and R5.

The present disclosure has been described with reference to embodiments. The embodiments are intended to be illustrative only, and it will be obvious to those skilled in the art that various modifications to a combination of constituting elements or processes in the embodiments could be developed and that such modifications also fall within the scope of the present disclosure.

Figure 12:
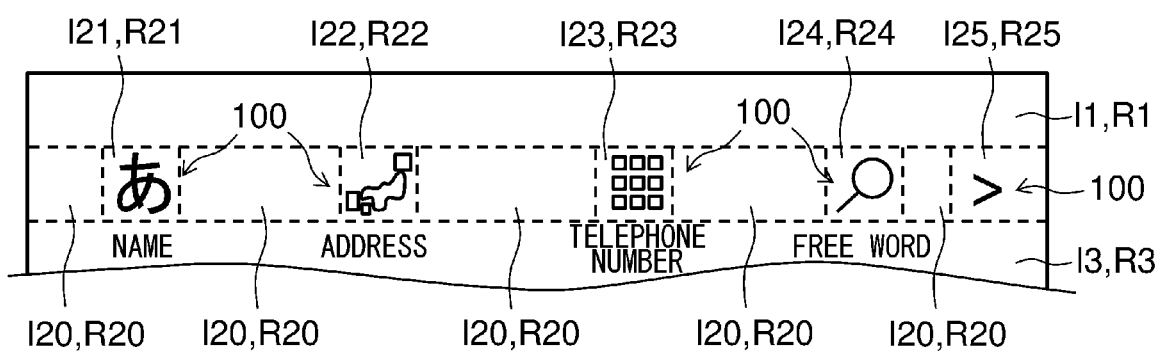
FIG. 12 is a diagram that illustrates part of a menu screen in a modification.

For example, when a first image is displayed, a first image region where touch detection is necessary and a touch detection region may be set for each GUI 100. FIG. 12 is a diagram that illustrates part of a menu screen in a modification. First image regions I21, I22, I23, I24, and I25 respectively include corresponding GUIs 100. Second image regions I20 are regions other than the first image regions I21 through I25 in a region between the second image region I1 and the second image region I3.

The touch detection region R21 coincides with the first image region I21, the touch detection region R22 coincides with the first image region I22, the touch detection region R23 coincides with the first image region I23, the touch detection region R24 coincides with the first image region I24, and the touch detection region R25 coincides with the first image region I25. The touch detection regions R20 coincide with the second image regions I20.

During the touch detection period T2a, the touch detection circuit 76 performs touch detection in the touch detection regions R21 through R25 in parallel and does not perform touch detection in the touch detection regions R20. More specifically, during the touch detection period T2a, the touch detection circuit 76 does not perform one or more signal processes for judging whether or not there has been a touch, with respect to the touch detection signals Rx supplied from the common electrodes 34 included in the touch detection regions R20, for example. This means that the touch detection circuit 76 does not perform touch detection in the touch detection regions R20. Also, with respect to the information regarding a touch position in the touch detection regions R20 supplied from the touch detection circuit 76, the control circuit 70 does not derive the coordinate data TD of the touch position, for example. Also, the control circuit 70 does not supply the coordinate data TD indicating a touch position in the touch detection regions R20 to the control device 12 in the host 10, for example. Also, with respect to the coordinate data TD indicating the touch detection regions R20 supplied from the control circuit 70, the control device 12 in the host 10 does not perform various processes required therefor, for example. In this modification, the processing related to touch detection can be further reduced.

The display device 22 may be set such that touch detection is not performed in part of the touch detection regions, irrespective of the displayed image. Also, supply of the touch drive signal TX to part of the touch detection regions may be stopped.

More specifically, it may be set not to perform touch detection in a region where touch detection is unnecessary. Also, supply of the touch drive signal TX to a region where touch detection is unnecessary may be stopped.

For example, a physical switch device may be sometimes provided around the touch operation surface of a display device or in an area that covers part of the touch operation surface. In such a case, it may be set not to perform touch detection in a touch detection region corresponding to a region around the switch device or a region where the switch device covers the touch operation surface. For the switch device, a press switch device or a dial switch device that can be rotatably operated may be used. For the dial switch device, a rotary switch device may be used.

The control circuit 70 may provide control such that the amplitude of a touch drive signal TX supplied to at least one common electrode 34 other than multiple common electrodes 34 in a touch detection region as a detection target becomes smaller than the amplitude of a touch drive signal TX supplied to the multiple common electrodes 34 in the touch detection region as a detection target, such as zero. Providing control such that the amplitude of a touch drive signal TX becomes zero corresponds to supplying no touch drive signal TX.

The radiation and the power consumption can be reduced when a touch drive signal TX with relatively larger amplitude is supplied to a smaller number of common electrodes 34. Accordingly, the control circuit 70 may provide control such that the amplitude of a touch drive signal TX supplied to common electrodes 34 other than the common electrodes 34 located adjacent to a touch detection region as a detection target becomes smaller, such as zero. In this case, the control circuit 70 provides control such that the amplitude of the touch drive signal TX supplied to the common electrodes 34 located adjacent to the touch detection region as a detection target becomes substantially identical with the amplitude of a touch drive signal supplied to the multiple common electrodes in the touch detection region as a detection target. Accordingly, the parasitic capacitance between a common electrode 34 in the touch detection region as a detection target and a common electrode 34 adjacent thereto is not charged by the touch drive signal TX. Therefore, the charging time of the parasitic capacitance in the common electrodes 34 in the touch detection region as a detection target is not longer than that in the first embodiment and the like in which all the common electrodes 34 are driven by a touch drive signal TX in common. Accordingly, the touch detection timing in the touch detection region as a detection target can be maintained. In this modification, power consumption and radiation can be further reduced.

Further, although the control data CD in the embodiments include information that specifies a touch detection region where touch detection is to be performed, the control data CD need not necessarily include such information. In this case, the control circuit 70 identifies a touch detection region where touch detection is unnecessary based on the image data DD. In the display device 22 to be mounted on a vehicle, the background of a menu screen or the like is often colored in black. Accordingly, when the entirety of a touch detection region is colored in a predetermined color, such as black, the control circuit 70 may identify the touch detection region as a touch detection region where touch detection is unnecessary. Such identification processing may be performed in the control device 12 instead. This modification allows greater flexibility in the configuration of the display system 1.

Although the control device 24 is included in the touch display 20 in each of the aforementioned embodiments, the control device 24 may be included in the host 10. Also, although the first drive circuit 72 generates the reference clock signal in each of the aforementioned embodiments, the second drive circuit 74 may generate the reference clock signal. Also, the number of touch detection periods included in a frame period may be more than three times the number of touch detection regions in the display device 22. These modifications allow greater flexibility in the configuration of the display system 1.

A decorative display, in which a decorative sheet is provided on the display surface of a display device, is known. For a decorative display, there is a need for displaying information required to be displayed on part of the display surface at a necessary timing. Therefore, applying the disclosure in each of the aforementioned embodiments to a decorative display is useful.

A display system according to one aspect of the present disclosure includes:

a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection;

a drive circuit that supplies a touch drive signal to each of the multiple common electrodes; and a touch detection circuit that performs detection of a touch by an object on the display device, based on a touch detection signal received from each of the multiple common electrodes, the display device includes multiple touch detection regions, and, among the multiple common electrodes, multiple common electrodes are arranged in each of the touch detection regions, and in the display system, touch detection is performed in part of the multiple touch detection regions, and touch detection is not performed in rest of the multiple touch detection regions.

According to this aspect, since touch detection is not performed in the rest of the multiple touch detection regions, the processing related to touch detection can be reduced.

In the display system according to the one aspect of the present disclosure, for example, within a frame period of the display device, a display period for which the display device displays an image and a touch detection period for which the touch detection circuit performs touch detection may be alternately arranged, and, when the display device displays a first image that includes a first image region where touch detection is necessary and a second image region where touch detection is unnecessary, the touch detection circuit may perform touch detection in a touch detection region defined based on the first image region and may not perform touch detection in a touch detection region defined based on the second image region, during the frame period.

In this case, when an image includes a region where touch detection is unnecessary, touch detection can be performed only in a necessary region of the image.

In the display system according to the one aspect of the present disclosure, for example, when the display device displays a second image constituted by a region where touch detection is necessary, the touch detection circuit may perform touch detection in each of the multiple touch detection regions during the frame period.

In this case, when an image is constituted by a region where touch detection is necessary, touch detection can be performed on the entire image.

In the display system according to the one aspect of the present disclosure, for example, within the frame period, a sum of touch detection periods when the first image is displayed may be equal to a sum of touch detection periods when the second image is displayed.

In this case, when a first image is displayed, the number of touch detection regions as detection targets is lower while the sum of the touch detection periods within a frame period is equal, compared to the case where a second image is displayed. Accordingly, the detection sensitivity can be improved.

In the display system according to the one aspect of the present disclosure, for example, within the frame period, a number of the touch detection periods when the first image is displayed may be lower than a number of the touch detection periods when the second image is displayed, and, within the frame period, a touch detection period when the first image is displayed may be longer than a touch detection period when the second image is displayed.

In this case, when a first image is displayed, a touch detection period is longer than that when a second image is displayed, so that the detection sensitivity can be improved.

In the display system according to the one aspect of the present disclosure, for example, within the frame period, a number of the touch detection periods when the first image is displayed may be equal to a number of the touch detection periods when the second image is displayed, and, when the first image is displayed, the touch detection circuit may perform, based on the touch detection signal received from a common electrode in a touch detection region as a detection target during multiple touch detection periods, touch detection in the touch detection region as the detection target for the multiple touch detection periods.

In this case, when a first image is displayed, the detection sensitivity can be improved, compared to the case where a second image is displayed.

In the display system according to the one aspect of the present disclosure, for example, to each of the multiple common electrodes, the drive circuit may supply a reference voltage for image display during the display period and supply a touch drive signal during the touch detection period, and, within the frame period, a sum of touch detection periods when the first image is displayed may be shorter than a sum of touch detection periods when the second image is displayed.

In this case, when a first image is displayed, the duration of supply of the touch drive signal within a frame period is shorter than that when a second image is displayed, so that radiation can be reduced.

In the display system according to the one aspect of the present disclosure, for example, within the frame period, a sum of display periods when the first image is displayed may be longer than a sum of display periods when the second image is displayed.

In this case, when a first image is displayed, the image quality can be improved, compared to the case where a second image is displayed.

The display system according to the one aspect of the present disclosure may further include a dial switch device, for example, part of or the entire of an operation surface of the dial switch device may cover part of a touch operation surface of the display device, and touch detection may not be performed in a touch detection region corresponding to a surrounding region of the operation surface of the dial switch device.

In this case, even when a finger touches a surrounding region of the dial switch device, it is not judged that there has been a touch. Therefore, execution of unintended processing for the user can be restrained.

In the display system according to the one aspect of the present disclosure, for example, the touch detection circuit may receive a touch detection signal from each of the multiple common electrodes in the part of the multiple touch detection regions where touch detection is performed, and the touch detection circuit may not receive a touch detection signal from each of the multiple common electrodes in the rest of the multiple touch detection regions.

In this case, the processing related to touch detection can be reduced.

In the display system according to the one aspect of the present disclosure, for example, the touch detection circuit may perform touch detection in the part of the multiple touch detection regions where touch detection is performed, and the touch detection circuit may not perform touch detection in the rest of the multiple touch detection regions.

In this case, the processing related to touch detection can be reduced.

The display system according to the one aspect of the present disclosure may further include a control circuit that controls the touch detection circuit, for example, the touch detection circuit may supply, to the control circuit, a result of touch detection in the multiple touch detection regions, the control circuit may derive, based on the result of touch detection, coordinate data that indicate a touch position of an object on the display device, with respect to the part of the multiple touch detection regions where touch detection is performed, and the control circuit may not derive the coordinate data that indicate the touch position of the object on the display device, with respect to the rest of the multiple touch detection regions.

In this case, the processing related to touch detection can be reduced.

The display system according to the one aspect of the present disclosure may further include, for example, a control circuit that controls the touch detection circuit, and a control device that performs processing depending on a touch by an object on the display device, the touch detection circuit may supply, to the control circuit, a result of touch detection in the multiple touch detection regions, the control circuit may derive, based on the result of touch detection in the multiple touch detection regions, coordinate data that indicate a touch position of an object on the display device and supply the coordinate data thus derived to the control device, the control device may perform processing depending on a touch by the object on the display device based on coordinate data that indicate the multiple touch detection regions, with respect to the part of the multiple touch detection regions where touch detection is performed, and the control device may not perform processing depending on the touch by the object on the display device, with respect to the rest of the multiple touch detection regions.

In this case, the processing related to touch detection can be reduced.

A display system according to one aspect of the present disclosure includes:

a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection;

a drive circuit that supplies a touch drive signal to each of the multiple common electrodes; and a touch detection circuit that performs detection of a touch by an object on the display device, based on a touch detection signal received from each of the multiple common electrodes, the display device includes multiple touch detection regions, and, among the multiple common electrodes, multiple common electrodes are arranged in each of the touch detection regions, the drive circuit supplies the touch drive signal to each of the multiple common electrodes when touch detection is performed in part of the multiple touch detection regions, and the drive circuit does not supply the touch drive signal to each of the multiple common electrodes when touch detection is not performed in rest of the multiple touch detection regions.

According to this aspect, radiation caused by the touch drive signal can be reduced. Also, since a touch is not detected in the rest of the multiple touch detection regions, the coordinates of a touch position need not be computed. Therefore, the computational amount can be reduced.

In the display system according to the one aspect of the present disclosure, for example, the display device may display an image that includes a first image region where touch detection is necessary and a second image region where touch detection is unnecessary, and part of the multiple touch detection regions may be defined based on the first image region, and rest of the multiple touch detection regions may be defined based on the second image region.

In this case, when an image includes a region where touch detection is unnecessary, touch detection can be performed only in a necessary region of the image.

The display system according to the one aspect of the present disclosure may further include a dial switch device, for example, part of or the entire of an operation surface of the dial switch device may cover part of a touch operation surface of the display device, and touch detection may not be performed in a touch detection region corresponding to a surrounding region of the operation surface of the dial switch device.

A control device according to one aspect of the present disclosure controls a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection, the control device includes:

a drive circuit that supplies a touch drive signal to each of the multiple common electrodes; and a touch detection circuit that performs detection of a touch by an object on the display device, based on a touch detection signal received from each of the multiple common electrodes, the display device includes multiple touch detection regions, and, among the multiple common electrodes, multiple common electrodes are arranged in each of the touch detection regions, and the control device performs touch detection in part of the multiple touch detection regions and does not perform touch detection in rest of the multiple touch detection regions.

According to this aspect, touch detection processing performed by the touch detection circuit can be reduced.

A control device according to one aspect of the present disclosure controls a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection, the control device includes:

a drive circuit that supplies a touch drive signal to each of the multiple common electrodes; and a touch detection circuit that performs detection of a touch by an object on the display device, based on a touch detection signal received from each of the multiple common electrodes, the display device includes multiple touch detection regions, and, among the multiple common electrodes, multiple common electrodes are arranged in each of the touch detection regions, the drive circuit supplies the touch drive signal to each of the multiple common electrodes when touch detection is performed in part of the multiple touch detection regions, and the drive circuit does not supply the touch drive signal to each of the multiple common electrodes when the touch detection circuit does not perform touch detection in rest of the multiple touch detection regions.

According to this aspect, radiation caused by the touch drive signal can be reduced, and the amount of computation for the coordinates of a touch position can also be reduced.

A control method according to one aspect of the present disclosure is used to control a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection, the control method includes:

supplying a touch drive signal to each of the multiple common electrodes; and performing detection of a touch by an object on the display device, based on a touch detection signal received from each of the multiple common electrodes, the display device includes multiple touch detection regions, and, among the multiple common electrodes, multiple common electrodes are arranged in each of the touch detection regions, and touch detection is performed in part of the multiple touch detection regions, and touch detection is not performed in rest of the multiple touch detection regions.

According to this aspect, touch detection processing can be reduced.

A control method according to one aspect of the present disclosure is used to control a display device including multiple gate lines, multiple source lines, multiple pixel electrodes provided respectively in regions defined by the multiple gate lines and the multiple source lines, and multiple common electrodes provided to face the multiple pixel electrodes and used for both image display and touch detection, the control method includes:

supplying a touch drive signal to each of the multiple common electrodes; and performing detection of a touch by an object on the display device, based on a touch detection signal received from each of the multiple common electrodes, the display device includes multiple touch detection regions, and, among the multiple common electrodes, multiple common electrodes are arranged in each of the touch detection regions, when touch detection is performed in part of the multiple touch detection regions, the touch drive signal is supplied to each of the multiple common electrodes, and, when touch detection is performed in rest of the multiple touch detection regions, the touch drive signal is not supplied to each of the multiple common electrodes.

According to this aspect, radiation caused by the touch drive signal can be reduced, and the amount of computation for the coordinates of a touch position can also be reduced.

While various embodiments have been described herein above, it is to be appreciated that various changes in form and detail may be made without departing from the spirit and scope of the invention(s) presently or hereafter claimed.

CROSS-REFERENCE TO RELATED APPLICATIONS

This application is a Continuation of International Application No. PCT/JP2020/027709, filed on Jul. 16, 2020, which in turn claims the benefit of Japanese Application No. 2019-145169, filed on Aug. 7, 2019 and Japanese Application No. 2019-220397, filed on Dec. 5, 2019, the disclosures of which Applications are incorporated by reference herein.

The invention claimed is:

1. A display system, comprising:
a display device comprising a plurality of gate lines, a plurality of source lines, a plurality of pixel electrodes provided respectively in regions defined by the plurality of gate lines and the plurality of source lines, and a plurality of common electrodes provided to face the plurality of pixel electrodes, the plurality of common electrodes being used for both image display and touch detection;
a drive circuit that supplies a touch drive signal to each of the plurality of common electrodes;
a touch detection circuit that performs detection of a touch by an object on the display device, based on a touch detection signal received from the plurality of common electrodes; and
a switch device, wherein
the display device includes a plurality of touch detection regions, and, among the plurality of common electrodes, plural common electrodes are arranged in each of the plurality of touch detection regions,
touch detection is performed in a first part of the plurality of touch detection regions, and touch detection is not performed in a remaining part of the plurality of touch detection regions,
part of or the entirety of the switch device covers a part of a touch operation surface of the display device,
touch detection is not performed in a first touch detection region corresponding to a surrounding region of the switch device and in a second touch detection region where the switch device covers the touch operation surface,
within a frame period of the display device, a display period for which the display device displays an image and a touch detection period for which the touch detection circuit performs touch detection are alternately arranged,
when the display device displays a first image that includes a first image region where touch detection is necessary and a second image region where touch detection is unnecessary, the touch detection circuit performs touch detection in a third touch detection region defined based on the first image region and does not perform touch detection in a fourth touch detection region defined based on the second image region, during the frame period,
when the display device displays a second image constituted by a second image region where touch detection is necessary, the touch detection circuit performs touch detection in each of the plurality of touch detection regions during the frame period,
to each of the plurality of common electrodes, the drive circuit supplies a reference voltage for image display during the display period and supplies the touch drive signal during the touch detection period, and within the frame period, a sum of touch detection periods when the first image is displayed is shorter than a sum of touch detection periods when the second image is displayed.

2. The display system according to claim 1, wherein, within the frame period, a sum of display periods when the first image is displayed is longer than a sum of display periods when the second image is displayed.

3. The display system according to claim 1, wherein the touch detection circuit is configured to receive the touch detection signal from each of the plurality of common electrodes in the first part of the plurality of touch detection regions where touch detection is performed, and the touch detection circuit is configured to not receive the touch detection signal from each of the plurality of common electrodes in the remaining part of the plurality of touch detection regions.

4. The display system according to claim 3, wherein the plurality of common electrodes is connected to the touch detection circuit via a plurality of switches, the plurality of switches is respectively provided with respect to a plurality of common electrodes arranged in each of the plurality of touch detection regions, the touch detection circuit receives the touch detection signal from each of the plurality of common electrodes in the first part of the plurality of touch detection regions, since one or more of the plurality of switches corresponding to the plurality of common electrodes in the first part of the plurality of touch detection regions is made conductive, and performs touch detection based on the touch detection signal thus received, and the touch detection circuit does not receive the touch detection signal from each of the plurality of common electrodes in the remaining part of the plurality of touch detection regions, since one or more of the plurality of switches corresponding to the plurality of common electrodes in the remaining part of the plurality of touch detection regions is made non-conductive.

5. The display system according to claim 1, wherein the touch detection circuit performs touch detection in the part of the first plurality of touch detection regions where touch detection is performed, and the touch detection circuit does not perform touch detection in the remaining part of the plurality of touch detection regions.

6. The display system according to claim 1, further comprising a control circuit that controls the touch detection circuit, wherein the touch detection circuit supplies, to the control circuit, a result of touch detection in the plurality of touch detection regions, the control circuit derives, based on the result of touch detection, coordinate data that indicate a touch position of the object on the display device, with respect to the first part of the plurality of touch detection regions where touch detection is performed, and the control circuit does not derive the coordinate data that indicate the touch position of the object on the display device, with respect to the remaining part of the plurality of touch detection regions.

7. The display system according to claim 1, further comprising:

a control circuit that controls the touch detection circuit; and a control device that performs processing depending on the touch by the object on the display device, wherein the touch detection circuit supplies, to the control circuit, a result of touch detection in the plurality of touch detection regions, the control circuit derives, based on the result of touch detection in the plurality of touch detection regions, coordinate data that indicate a touch position of the object on the display device and supplies the coordinate data thus derived to the control device, the control device performs processing depending on the touch by the object on the display device based on the coordinate data, with respect to the first part of the plurality of touch detection regions where touch detection is performed, and the control device does not perform processing depending on the touch by the object on the display device based on the coordinate data, with respect to the remaining part of the plurality of touch detection regions.

8. A display system, comprising:

a display device comprising a plurality of gate lines, a plurality of source lines, a plurality of pixel electrodes provided respectively in regions defined by the plurality of gate lines and the plurality of source lines, and a plurality of common electrodes provided to face the plurality of pixel electrodes, the plurality of common electrodes being used for both image display and touch detection;

a drive circuit that supplies a touch drive signal to each of the plurality of common electrodes;

a touch detection circuit that performs detection of a touch by an object on the display device, based on a touch detection signal received from the plurality of common electrodes; and a switch device, wherein the display device includes a plurality of touch detection regions, and, among the plurality of common electrodes, plural common electrodes are arranged in each of the plurality of touch detection regions, the drive circuit supplies the touch drive signal to each of the plurality of common electrodes when touch detection is performed in a first part of the plurality of touch detection regions, the drive circuit does not supply the touch drive signal to each of the plurality of common electrodes when touch detection is not performed in a remaining part of the plurality of touch detection regions, part of or the entirety of the switch device covers a part of a touch operation surface of the display device, touch detection is not performed in a first touch detection region corresponding to a surrounding region of the switch device and in a second touch detection region where the switch device covers the touch operation surface, within a frame period of the display device, a display period for which the display device displays an image and a touch detection period for which the touch detection circuit performs touch detection are alternately arranged, when the display device displays a first image that includes a first image region where touch detection is necessary and a second image region where touch detection is unnecessary, the touch detection circuit performs touch detection in a third touch detection region defined based on the first image region and does not perform touch detection in a fourth touch detection region defined based on the second image region, during the frame period, when the display device displays a second image constituted by a second image region where touch detection is necessary, the touch detection circuit performs touch detection in each of the plurality of touch detection regions during the frame period, to each of the plurality of common electrodes, the drive circuit supplies a reference voltage for image display during the display period and supplies the touch drive signal during the touch detection period, and within the frame period, a sum of touch detection periods when the first image is displayed is shorter than a sum of touch detection periods when the second image is displayed.

9. The display system according to claim 8, wherein when the display device displays the first image that includes the first image region where touch detection is necessary and the second image region where touch detection is unnecessary, the first part of the plurality of touch detection regions is defined based on the first image region, and the remaining part of the plurality of touch detection regions is defined based on the second image region.

10. A control method for controlling a display device comprising a plurality of gate lines, a plurality of source lines, a plurality of pixel electrodes provided respectively in regions defined by the plurality of gate lines and the plurality of source lines, and a plurality of common electrodes provided to face the plurality of pixel electrodes, the plurality of common electrodes used for both image display and touch detection, the control method comprising:

supplying a touch drive signal to each of the plurality of common electrodes; and performing detection of a touch by an object on the display device, based on a touch detection signal received from the plurality of common electrodes, wherein the display device includes a plurality of touch detection regions, and, among the plurality of common electrodes, plural common electrodes are arranged in each of the plurality of touch detection regions, touch detection is performed in a first part of the plurality of touch detection regions, and touch detection is not performed in a remaining part of the plurality of touch detection regions, the display device further includes a switch device, part of or the entirety of the switch device covers a part of a touch operation surface of the display device, touch detection is not performed in a first touch detection region corresponding to a surrounding region of the switch device and in a second touch detection region where the switch device covers the touch operation surface, within a frame period of the display device, a display period for which the display device displays an image and a touch detection period for which touch detection is performed are alternately arranged, when the display device displays a first image that includes a first image region where touch detection is necessary and a second image region where touch detection is unnecessary, touch detection is performed in a third touch detection region defined based on the first image region and touch detection is not performed in a fourth touch detection region defined based on the second image region, during the frame period, when the display device displays a second image constituted by a second image region where touch detection is necessary, touch detection is performed in each of the plurality of touch detection regions during the frame period, to each of the plurality of common electrodes, a reference voltage for image display is supplied during the display period and the touch drive signal is supplied during the touch detection period, and within the frame period, a sum of touch detection periods when the first image is displayed is shorter than a sum of touch detection periods when the second image is displayed.

* * * * *